United States Patent [19]

Gupta

[11] Patent Number: 5,715,262
[45] Date of Patent: Feb. 3, 1998

[54] ERRORS AND ERASURES CORRECTING REED-SOLOMON DECODER

[75] Inventor: Alok Gupta, Sunnyvale, Calif.

[73] Assignee: LSI Logic Corporation, Milpitas, Calif.

[21] Appl. No.: 501,284

[22] Filed: Jul. 12, 1995

[51] Int. Cl.$^6$ .................................................. H03M 13/00
[52] U.S. Cl. ....................................................... 371/37.1
[58] Field of Search ............................................ 371/37.1

[56] References Cited

U.S. PATENT DOCUMENTS

| | | | |
|---|---|---|---|
| 4,649,541 | 3/1987 | Lahmeyer | 371/37.1 |
| 4,873,688 | 10/1989 | Maki et al. | 371/37.1 |
| 5,107,503 | 4/1992 | Riggle et al. | 371/37.1 |
| 5,285,455 | 2/1994 | Tong et al. | 371/37.5 |
| 5,384,786 | 1/1995 | Dudley et al. | 371/37.1 |
| 5,446,743 | 8/1995 | Zook | 371/37.1 |
| 5,471,485 | 11/1995 | Tong | 371/37.1 |
| 5,490,154 | 2/1996 | Mester | 371/37.1 |
| 5,517,509 | 5/1996 | Yoneda | 371/37.1 |
| 5,555,516 | 9/1996 | Zook | 364/746.1 |

OTHER PUBLICATIONS

Truong et al., "Simplified procedure for correcting both errors and erasures of Reed–Solomon code using Euclidean algorithm", IEE Proceedings, vol. 135, No. 6, Nov. 1988, pp. 318–324. Nov. 1988.

Berlekamp et al., Reed–Solomon Codes and Their Applications, IEEE Press, 1994, Chapter 10, "A Hypersystolic Reed–Solomon Decoder," pp. 205–241.

Tong, A 40–MHZ Encoder–Decoder Chip Generated by a Reed–Solomon Code Compilier, IEEE 1990 Custom Integrated Circuits Conference, CH2860–5/90/0000–0065, pp. 13.5.1–13.5.4.

Brent et al., Systolic VLSI Arrays for Polynomial GCD Computation, IEEE Transactions on Computers, vol. c–33, No. 8, Aug. 1984, pp. 731–736.

*Primary Examiner*—Stephen M. Baker
*Attorney, Agent, or Firm*—Townsend and Townsend and Crew LLP; Henry K. Woodward

[57] ABSTRACT

A Reed-Solomon decoder and a decoding algorithm executed by the decoder are disclosed. The decoder includes a syndrome computer and a syndrome processor. The syndrome computer is a pipelined functional unit for computing syndromes from a received codeword and storing erasure location members as flagged by an Erasure Flag signal. The syndrome processor includes a pipelined functional unit and a Chien search circuit for receiving from said syndrome computer the computed syndromes, erasure locations, and number of erasures and computing erasure locator polynomial, modified syndrome polynomial, error locator and error evaluator polynomials, error-erasure locator polynomial, and error value at an error location at each error location found by the Chien search circuit.

2 Claims, 4 Drawing Sheets

Diag. 01

Erasure loc. pol.

Sigma pol.

Error-erasure loc. pol.

ERRORS AND ERASURES CORRECTING REED-SOLOMON DECODER

BACKGROUND OF THE INVENTION

This invention relates generally to the encoding and decoding of digital data, and more particularly the invention relates to Reed-Solomon (RS) coding and decoding for error and erasure identification and correction.

The trend toward higher densities and data rates in magnetic data recording has required error control coding and modulating techniques. Error detection and correction coding can use a polynomial with binary coefficients to represent a sequence of binary bits and with a plurality of check bits determined by a coding process which requires that every code word be divisible by a preselected polynomial with zero remainder. A plurality of cyclic codes can be interleaved to form a cyclic code for further error reduction. Further, the binary base field can be extended to a finite field of $2^m$ elements, known as a Galois field $GF(2^m)$ in which all elements are represented by m-bit binary symbols.

The Reed-Solomon (RS) code is based on an extension of the concepts of cyclic codes in an extended binary field $GF(2^m)$. All processing of these polynomials is done using sum and product operations defined in the extension field $GF(2^m)$. In this system, the generator $G(z)$, the information sequence $B(z)$, the remainder $C(z)$, and the code word $W(z)$ are all polynomials whose coefficients are elements in $GF(2^m)$ in the form of m-bit bytes.

An RS code is a (N,K) block code, where each codeword of length N symbols consists of K message symbols and R=N−K parity symbols, generated by the RS encoder from the K message symbols. The code is capable of correcting up to $$[R/2]$$

errors or R erasures or all combinations of v errors and e erasures for $2v+e \leq R$.

The algorithm for error-erasure correction as published in the literature is as follows:

a) compute the set of R syndromes $s_0, s_1 \ldots s_{R-1}$ corresponding to the R roots of the generator polynomial. Store the e erasure location numbers.

b) Compute the erasure location polynomial $$\Gamma(x) = \prod_{k=1}^{e} (x + \alpha^{j_k})$$

from the e known erased locations.

c) Solve the following key equation to obtain the error-erasure locator polynomial and error evaluator polynomial.

$$s(x)\Gamma(x)\sigma(x) = \omega(x) \bmod x^R$$

where $$s(x) = \sum_{i=0}^{R-1} s_i x^i$$

The Euclidean algorithm can be used to find the error locator polynomial $\sigma(x)$ or equivalently error-erasure locator polynomial $$\psi(x) = \sigma(x)\Gamma(x)$$

and $\omega(x)$ as follows:

Compute Forney's modified syndrome polynomial $$T(x) = s(x)\Gamma(x) \bmod x^R$$

Initialize the four polynomials as follows:

$$\Psi_{-1}=0, \Psi_0=\Gamma(x), \omega_{-1}=x^R, \text{ and } \omega_0=T(x). \text{ Set } i=1.$$

1. Divide $\omega_{i-2}$ by $\omega_{i-1}$ to obtain the quotient $q_i(x)$ and the remainder $\omega_i$.
2. Compute $$\Psi_i(x) = \Psi_{i-2}(x) + q_i(x)\Psi_{i-1}(x)$$

3. If $\deg\omega(_i) < (R+e)/2$, then $\psi_i(x)$ and $\omega(x)=\omega_i(x)$, done. Else $i=i+1$, go to step 1.

d) Next in the decoding is to find the roots of the error-erasure locator polynomial by evaluating $\psi(x)$ exhaustively at all legitimate field locations. The technique is known as Chien search. Once an error location is found, the error value for that location needs to be computed. If $\alpha^{-i}$ is the root of $\psi(x)$, then error value $e_i$ is computed by the following formula $$e_i = \alpha^i \frac{\omega(\alpha^{-i})}{\Psi'(\alpha^{-i})}$$

e) Finally, the error correction is completed by adding the error value to the erroneous byte read from the error location.

Most of the applications of the RS code, so far, have employed decoders which are capable of correcting errors only. The VLSI semiconductor implementations of errors only correcting RS decoders have been reported. In the future, RS decoders with errors and erasures correction capabilities can be expected to be employed in a variety of applications for additional coding gain. The erasure correction does not provide significant additional gain on the pure Gaussian channel. However, it is of benefit on certain interference channels where the interference can be detected and treated as erasures. The erasure correction can also be employed in concatenated coding schemes where the inner code is usually a convolutional or trellis code and the Viterbi decoder is capable of passing some side information to the RS decoder where the RS code is used as an outer code.

SUMMARY OF THE INVENTION

The present invention is directed to an RS decoder for correcting errors and erasures which is based on a simplified algorithm and architecture.

The decoder comprises two fully pipelined blocks including a syndrome computer and a syndrome processor. The syndrome computer includes two finite field multipliers, three constant multipliers, two adders, a dual port asynchronous random access memory (RAM), and a finite field counter.

Once the syndromes are calculated, the syndrome processor computes the error erasure locator polynomial, modified syndrome polynomial, the error locator, the error evaluator polynomials from the Euclidean algorithm, the error-erasure locator polynomial, and the error value at the error location by a Chien search circuit. The processor comprises two asynchronous RAMs to store syndromes and erasure location numbers from the syndrome computer and also all the intermediate and final results during the syndrome processing. A main processing unit includes a pair of general finite field multiplier-adder circuits and a single finite field square circuit. The dedicated Chien search circuit is used for first search of error locations and for providing the error locations and for providing the error locations to the main processing unit with the error location number. The main processing unit evaluates the error evaluator polynomial using one multiplier while the other multiplier is used to evaluate the even part of the error-erasure locator polynomial and the inversion thereof in parallel. The parallelism reduces total time required to compute an error value.

After the decoding is complete, the number of errors and the error location-value are output along with a decoding status signal indicating successful or unsuccessful decoding.

The invention and objects and features thereof will be more readily apparent from the following description and appended claims when taken with the drawings.

DETAILED DESCRIPTION OF PREFERRED EMBODIMENTS

Figure 1:
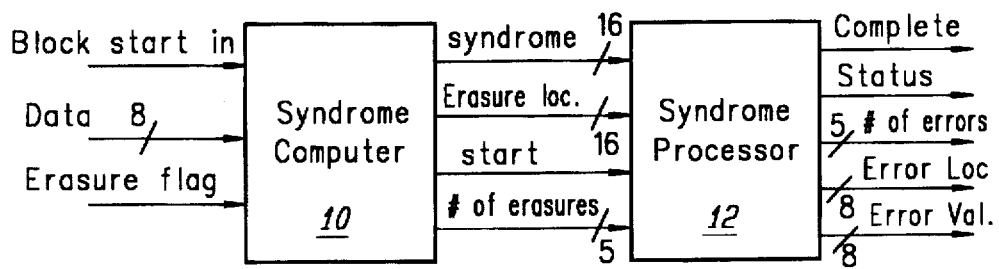
FIG. 1 is a block diagram of an RS decoder in accordance with the invention.

The RS decoder in accordance with the invention is shown in FIG. 1 and includes two fully pipelined blocks. The first block 10 is a syndrome computer which computes the syndromes from the received codeword and stores the erasure location numbers as flagged by the 'Erasure flag' signal. All the remaining processing is done in the second block 12 syndrome processor. Other input parameters not shown in the diagram are a finite field number corresponding to the codeword length N, the redundance R and the maximum number of symbols to be corrected t. These parameters can be changed dynamically from codeword to codeword, at the same time when the 'Block start in' goes HIGH.

Figure 2:
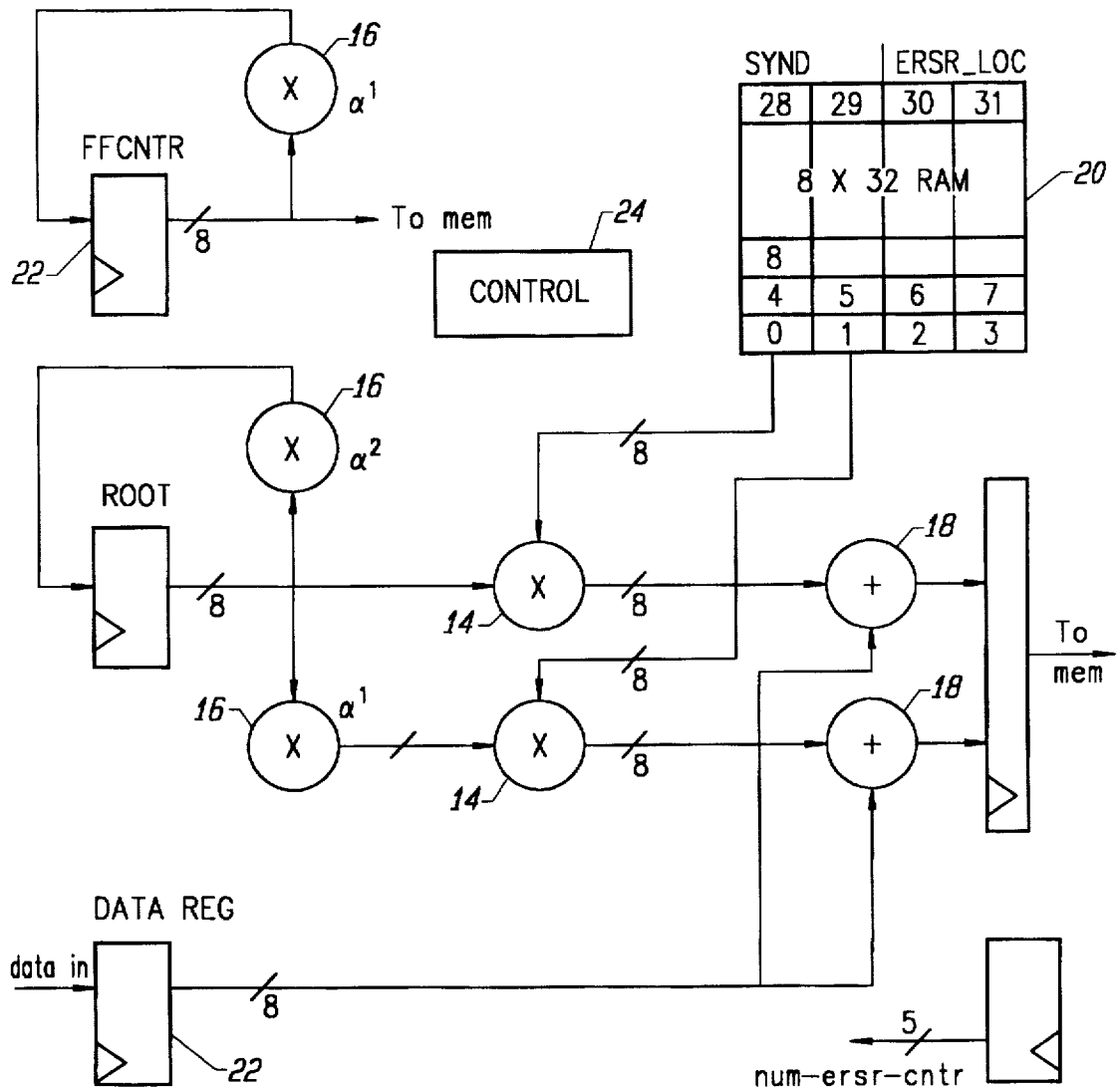
FIG. 2 is a functional block diagram of the syndrome computer in the decoder of FIG. 1.

The block diagram of the syndrome computer 10 is given in FIG. 2. It includes of two general finite field multipliers 14, three constant multipliers 16, two adders 18, one 18×32 dual port asynchronous RAM 20, one finite field counter register 22 and simple control circuits 24. Half the RAM space is used to store 16 syndromes and the other half is used to store at most 16 erasure location numbers. The syndromes are stored at locations 0, 1, 4, 5, 8, 9, and so on. The erasure locations are stored at locations 2, 3, 6, 7, 10, 11, and so on. A new input codeword symbol is accepted every 8 cycles and even and odd syndromes are computed every cycle using two multiplier-accumulator circuits. Thus for each input codeword symbol, a total of 16 computations are performed for 16 syndromes. After the entire received codeword has been processed, this block passes the 16 syndromes and 16 or less erasure locations in 8 cycles to the syndrome processing block. 2 syndromes and 2 erasure locations at a time, using a 32-bit wide buss. It also passes the number of erasures to the next block along with a 'start' signal. This block is then ready to process the next codeword with or without any gap in between.

Figure 3:
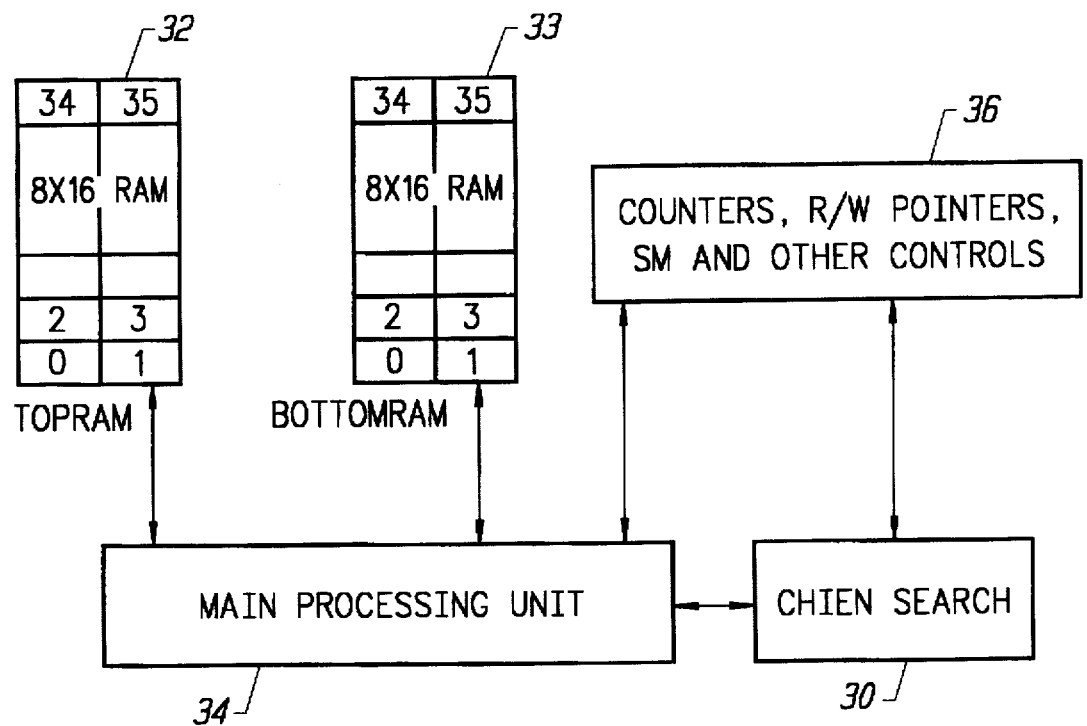
FIG. 3 is a functional block diagram of the syndromes processor in the decoder of FIG. 1.

The syndrome processor block 12 is shown in FIG. 3 and computes the erasure locator polynomial, modified syndrome polynomial, the error locator and the error evaluator polynomials from the Euclidean algorithm the error-erasure locator polynomial, and finally the error value at the error location found by a Chien search circuit. The Chien search circuit 30 is part of this block. All the processing within this block has to be completed within the codeword time of the next incoming codeword, which puts a lower limit on the minimum codeword size for a given redundancy.

Two 18×16 asynchronous RAMs 32, 33 are used to store the syndromes and the erasure location numbers from the syndrome computer block and to store all the intermediate and final results during the syndrome processing. The main processing unit 34 includes a pair of general finite field multiplier-adder circuits and a single finite field square circuit. The dedicated Chien search circuit 30 is used for fast search of error locations. Once the Chien search circuit finds an error location, it supplies the main processing unit with the error location number. The main processing unit evaluates the error evaluator polynomial using one multiplier while it uses the other multiplier to evaluate the even part of the error-erasure locator polynomial and compute the inversion in parallel. This parallelism reduces the total time required to compute an error value. The sequence of decoding operation is controlled by a state-machine 36 with 27 states. Two 5-bit counters are used to control the inner and outer loops of the decoding steps.

After the decoding is complete, the number of errors and the error location-value pairs along with a decoding status signal (indicating successful or unsuccessful decoding) are then output to the outside world. The error location-value pairs are output in sequence, one at a time. The total time T (in number of clock cycles) taken by this block is a function of codeword length N, redundancy R, the actual number of errors and erasures the codeword contains and is given by the following expression:

$$T = R^2 + 4R + \left\lceil \frac{R+1}{2} \right\rceil + N + 15 + 6e + 8v + ev +$$

$$(e+v)\max \left\{ \left\lfloor \frac{(e+v+2)}{2} \right\rfloor + 6, (e+v) \right\}$$

For a given R and N, the worst case time is obtained by setting v=0 and e=R. The worst case time sets the lower limit on the codeword size for a given R. In practice the codeword size is normally much higher than the minimum codeword size supporting by this architecture.

Consider now the decoding algorithm. The decoder assumes that the generator polynomial used for encoding the message is $$g(x) = \prod_{i=0}^{R-1} (x + \alpha^i)$$

where $\alpha$ is the root of the binary primitive polynomial $x^8+x^4+x^3+x^2+1$. The implemented decoding algorithm can be described by the following six steps.

a) Compute the set of R syndromes $s_0, s_1 \ldots s_{R-1}$ corresponding to the R roots of the generator polynomial. The syndrome $s_i$ can be obtained by evaluating the received codeword polynomial R(x) at x+$\alpha^i$. Also, store the 'e' erasure location numbers. If an erasure is flagged at location j within the codeword then $\alpha^{-j}$ is stored in the memory as an erasure location number.

b) Compute the erasure location polynomial from the 'e' known erased locations:

$$\Gamma(x) = \prod_{k=1}^{e} (x + \alpha^{-jk})$$

c) Solve the following key equation to obtain the error-erasure locator polynomial and error evaluator polynomial.

$$s(x)\, \Gamma(x)\sigma(x) = \omega(x) \bmod x^R$$

where $$s(x) = \sum_{i=0}^{R-1} s_i x^i$$

The Euclidean algorithm can be used to find the error locator polynomial $\sigma(x)$ or equivalently error-erasure locator polynomial $$\psi(x) = \sigma(x)\Gamma(x)$$

and $\omega(x)$ as follows:

Compute Forney's modified syndrome polynomial $$T(x) = s(x)\Gamma(x) \bmod x^R$$

Initialize the four polynomials as follows:

$\Psi_{-1}=0$, $\Psi_0=\Gamma(x)$, $\omega_{-1}=x^R$, and $\omega_0=T(x)$. Set i=1.

I. Divide $\omega_{i-2}$ by $\omega_{i-1}$ to obtain the quotient $q_i(x)$ and the remainder $\omega_i$.

II. Compute $$\Psi_i(x) = \Psi_{i-2}(x) + q_i(x)\Psi_{i-1}(x)$$

III. If $\deg(\omega_i) < (R+e)/2$, then $\psi_i(x)$ and $\omega(x) = \omega_i(x)$, done. Else i=i+1, go to step 1.

d) The next step in the decoding is to find the roots of the error-erasure locator polynomial by evaluating $\psi(x)$ exhaustively at all legitimate field locations. This technique is known as Chien search. 'i' is the error location if $\sigma(\alpha^i)=0$. Hence, the Chien search involves evaluating the polynomial of degree v for all valid field locations i, i=0 to N−1 where N is the codeword length. Chien search is relatively simple but a time consuming process.

e) Next, the error value for an erased location or an error location as found during the Chien search needs to be computed. If $\alpha^{-i}$ is the root of $\psi(x)$, then error value $e_i$ is computed by the following formula $$e_i = \alpha^i \frac{\omega(\alpha^{-i})}{\psi'(\alpha^{-i})}$$

where $\psi'(x)$ is the derivative of $\psi(x)$. With some algebraic manipulation, the above formula can easily be reduced to $$e_i = \frac{\omega(\alpha^{-i})}{\psi_{even}(\alpha^{-i})}$$

where $\psi_{even}$ is the even part of $\psi(x)$.

f) Finally, the error correction is completed by adding the error value to the erroneous byte read from the error location.

Consider now the data structure and computational complexity of each decoding step. The overall decoder architecture as implemented is described above with reference to FIGS. 1–3.

Syndromes Computation—The computation of R syndromes from the received codeword polynomial requires polynomial evaluation. For example, to compute the ith syndrome, the received codeword polynomial $R(x)=R_{N-1}x^{N-1}+R_{N-2}x^{N-2}+\ldots+R_1x+R_0$ must be evaluated at $\alpha^i$. Horner's rule can be applied for polynomial evaluation as follows:

$$s_i = (\ldots (R_{N-1}a^i + R_{N-2})a^i + \ldots + R_1)a^i + R_0$$

Figure 4:
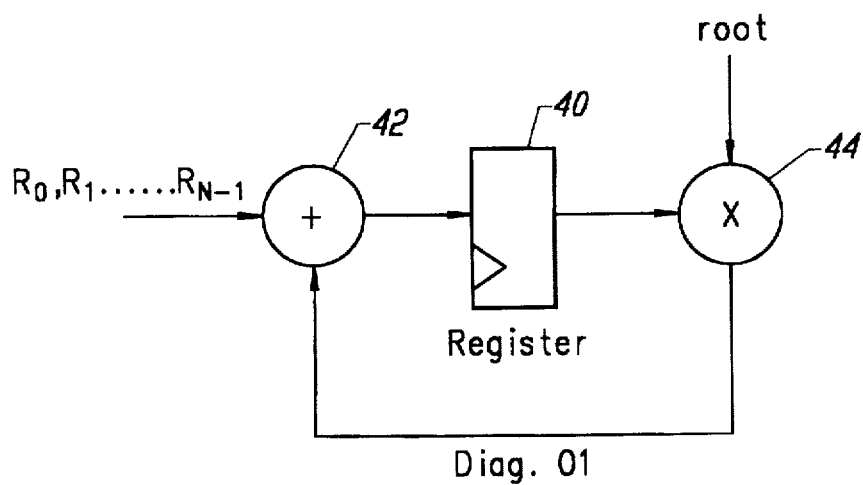
FIG. 4 is a multiply-accumulate finite field circuit as used in polynomial evaluation.

The multiply-accumulate finite field circuit of FIG. 4 can be used for polynomial evaluation using Horner's rule.

Before computation begins, the register 40 is cleared. The coefficients of the received codeword polynomial are input to the adder 42, in sequence, starting with the highest order term first. After the last coefficient has been received, the register contains the syndrome $s_i$. The sequential evaluation of polynomial of degree N−1 requires N cycles of multiplier 44. The set of R syndromes can be computed using the same circuit for $\alpha^i$, i=0 to R−1, the R roots of generator polynomial. The total number of computations required to compute the set of R syndromes is NR. In other words, for each new codeword symbol at the input, the syndrome computer circuit needs to perform R number of finite field multiplications and additions. In a parallel implementation of the syndrome computer, for each new codeword symbol, R computations are performed at the same time using R constant finite field multipliers and R adders.

Computing Erasure Locator Polynomial—The erasure locator polynomial of degree e, $$\Gamma(x) = \prod_{k=1}^{e} (x + E_k)$$

needs to be computed from e known erasure location numbers. Let e erasure location numbers are stored at memory location 1, 2, ..., e in memory 50 as shown in the FIG. 5. The location 0 of memory 52 should be initialized to 1. The algorithm to compute the erasure location polynomial using the multiply and add circuit in FIG. 5 can be stated as follows:

```
for (i=1; i≤ e; ++i) {
    A<=mem1[i];
    B<=0;
    for(j=i; j≥1; —j) }
        C<=B;
        B<=mem2[j-1];
        mem2[j]<=A*B+C;
    }
}
```

Figure 5:
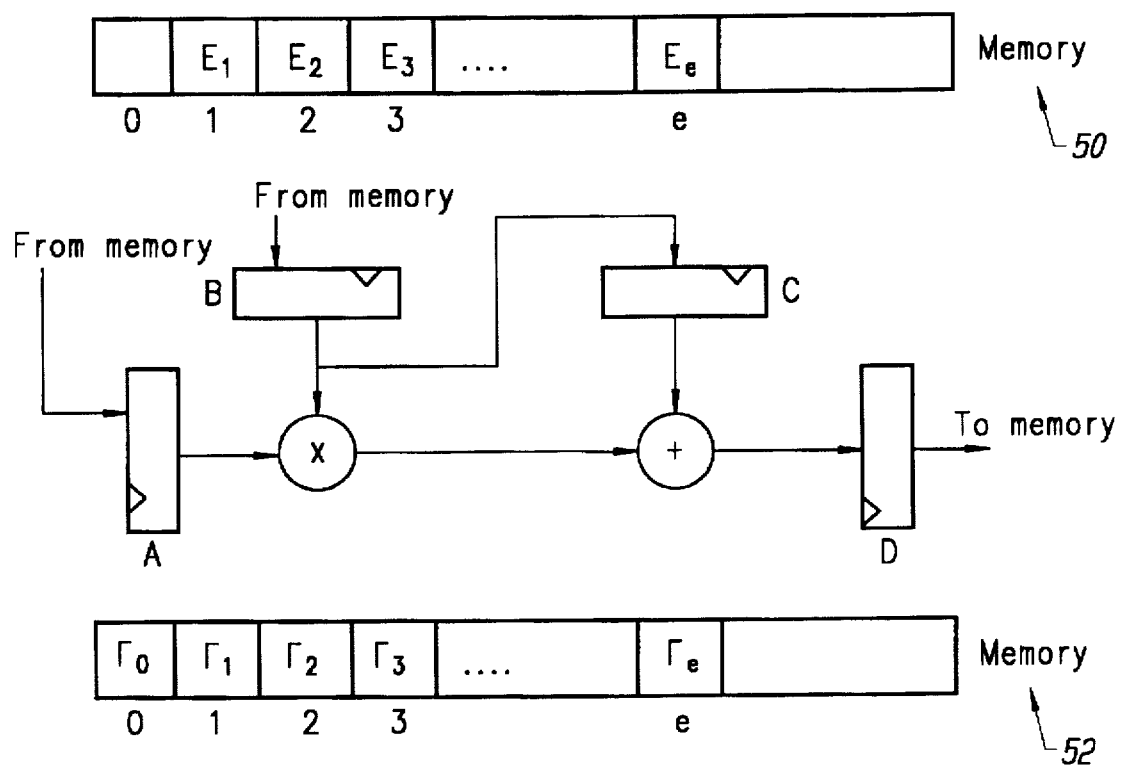
FIG. 5 is circuitry for erasure location polynomial computation.

The computational complexity of the algorithm is $e(e+1)/2$. After the computation is complete, $\Gamma(x)=\Gamma_0 x^e + \Gamma_1 x^{e-1} + \Gamma_2 x^{e-2} + \ldots + \Gamma_e$ appears in memory 52 as shown in FIG. 5, where $\Gamma_0=1$. Note that memory 50 and memory 52 can be different parts of one physical memory.

Computing Modified Syndrome Polynomial—The modified syndrome polynomial T(x) is given as $T(x)=s(x)\,\Gamma(x) \bmod x^R$. Let $$s(x)=s_{R-1}x^{R-1}+s_{R-2}x^{R-2}+\ldots+s_1x+s_0.$$

$$\Gamma(x)=\Gamma_0 x^e + \Gamma_1 x^{e-1} + \Gamma_2 x^{e-2} + \ldots + \Gamma_e.$$

$$T(x)=T_{R-1}x^{R-1}+T_{R-1}x^{R-2}+\ldots+T_1x+T_0.$$

Then the coefficients of T(x) can be written as $T_0 = s_0 \Gamma_e$
$T_1 = s_1 \Gamma_e + s_0 \Gamma_{e-1}$
$T_2 = s_2 \Gamma_e + s_1 \Gamma_{e-1} + s_0 \Gamma_{e-1}$

.

$T_k = \sum_{j=0} s_{k-j} \Gamma_{e-j}, k = 0 \text{ to } R - 1.$

The algorithm to compute the modified syndrome polynomial can be stated as follows:

```
for(i=0; i<R; ++i) {
    C<=0;
    j<=i;
    k<=0;
    while (j≥0 and e−k≥0) {
        A<=S[j];
        B<=Γ[e−k]
        C<=C+A*B;
        −−j;
        ++k;
    }
    T[i]<=C;
}
```

Figure 6:
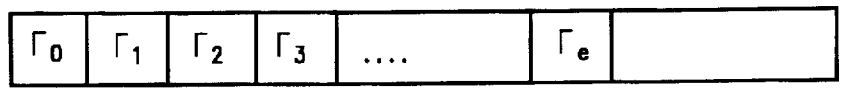
FIG. 6 is circuitry for computing coefficients in a modified syndrome polynomial.
Figure 6:
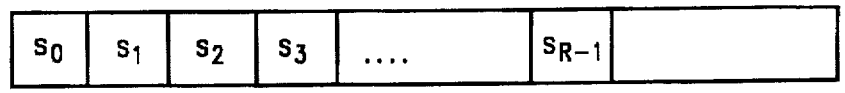
Figure 6:
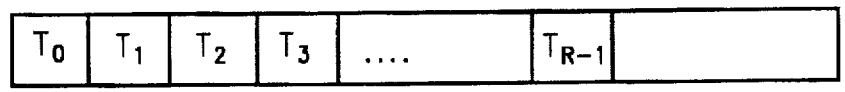
Figure 6:
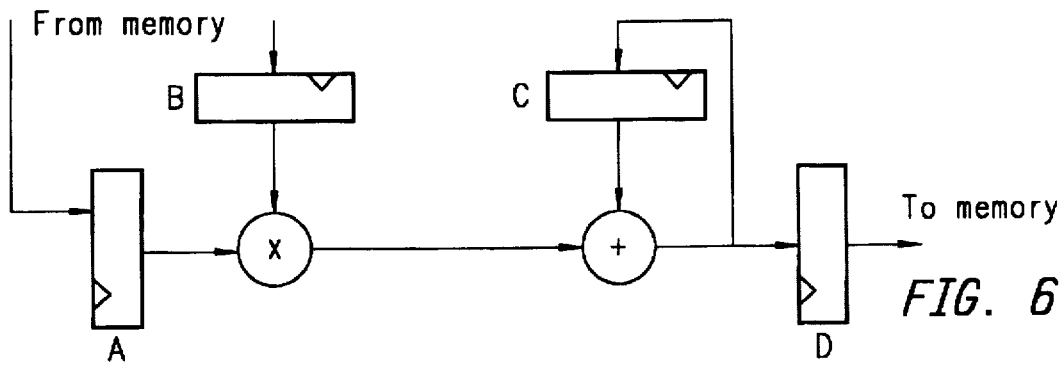

The data structure and circuit shown in FIG. 6 can be used to compute the coefficients of T(x). The complexity of the algorithm is R(e+1)−e(e+1)/2.

Euclidean Algorithm—The Euclidean algorithm is implemented using known approaches. For a correctable error pattern, the erasure locator polynomial is a factor of the final error-erasure locator polynomial. Hence, there is no need to initialize the $\sigma_0$ with the erasure locator polynomial as described above. The Euclidean initialization can be same as the error-only case which is as follows.

$\sigma_{-1}=0$, $\sigma_0=1$, $\omega_{-1}=x^R$, and $\omega_0=T(x)$.

In addition the algorithm has the properties similar to the error-only case, that is $deg\sigma_i + deg\omega_{i-1}=R$ and $deg\sigma_i + deg\omega_i < R$. Hence the idea of polynomial packing can still be used minimizing the storage requirement for the Euclidean algorithm. The only difference is that number of iterations required is no longer R, but it is (R−e), where e is the degree of the erasure locator polynomial. It can be easily proven that (R−e) iterations of Euclidean algorithm results in $deg\omega < (R+e)/2$.

After the Euclidean algorithm terminates in (R−e) iterations, the final error-erasure locator polynomial can be obtained by multiplying the error locator polynomial with the erasure locator polynomial.

Figure 7:
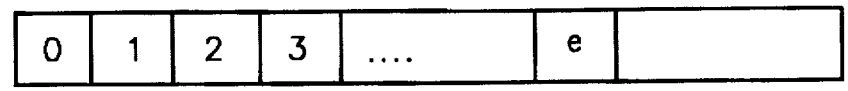
FIG. 7 is circuitry for computing coefficients of the error-erasure polynomial.
Figure 7:
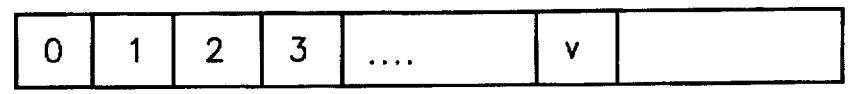
Figure 7:
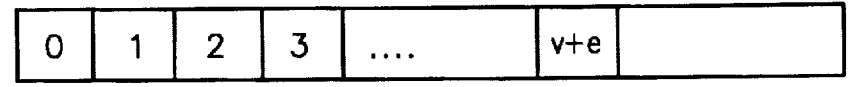
Figure 7:
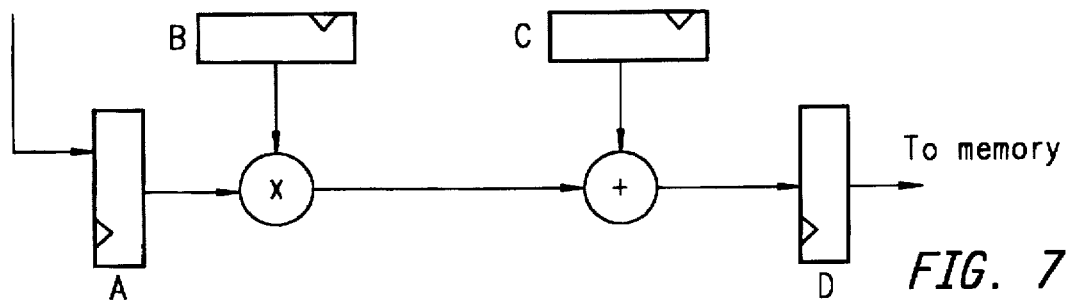

Computing Error-Erasure Locator Polynomial—The error-erasure locator polynomial is obtained by multiplying the erasure locator polynomial of degree e with the error locator polynomial of degree v from the Euclidean algorithm. The following algorithm, data structure and circuit of FIG. 7 can be used to compute the coefficients of the error-erasure locator polynomial $\psi(x)=\sigma(x)\Gamma(x)$.

```
for(i=0; i≤(e+v); ++i)ψ[i]=0;
for(i=0; i≤v; ++i) {
    A<=sigma[i];
    for(j=e; j≥0; −−j) {
        B<=Γ[j]
        C<=ψ[i+e−j]
        ψ[i+e−j]=A*B+C;
    }
}
```

The computational complexity of the algorithm is (e+v)+ (e+1) (v+1).

Searching for Error Locations Using Chien Search—The Chien search is performed using the approach described in the article by Po Tong entitled "A 40-MHz Encoder-Decoder Chip Generated by a Reed-Solomon Code Compiler," IEEE 1990 Custom Integrated Circuits Conference. The error locator polynomial (maximum degree 8) is evaluated in parallel for each valid field location using 9 registers, 8 constant finite field multipliers and many inputs finite field adders.

Computing Error Value—The error value is computed using the formula $$e_i = \frac{\omega(\alpha^{-1})}{\Psi_{even}(\alpha^{-1})}$$

It involves evaluating $\omega$ of degree at most e+v−1 at $\alpha^{-1}$, $\Psi_{even}$ of degree $$\left\lfloor \frac{(e+v)}{2} \right\rfloor$$

at $\alpha^{-1}$ and one division.

The polynomial $\omega$ and $\psi_{even}$ can be evaluated using the same circuit as shown in the diagram 01. The computational complexity of $\omega$ and $\psi_{even}$ polynomial evaluation is (e+v) and $$\left\lceil \frac{(e+v+1)}{2} \right\rceil$$

respectively. The division by a non-zero finite field element 'a' can be performed in 7 cycles using the following expression.

$((((((a^2*a)^2*a)^2*a)^2*a)^2*a)^2*\omega(a^{-1})$

Hence, there is no need for an inversion circuit which is quite expensive.

There has been described a two-pipeline stage programmable RS decoder for error-erasure correction. The architecture uses only four finite field multipliers, two in each pipelined block. An inversion circuit, which is quite expensive to implement, has been completely avoided. Dual port RAMs instead of registers are used for all the storage requirements. Extensive use of sequential finite field computations in each block results in complex control but smaller silicon area suitable for cost sensitive applications. The decoder has been implemented in VHDL. The Synopsys VHDL compiler and the Design compiler have been used to map the VHDL RTL code to LSI LCB500K standard cell library and to perform logic optimization for desired speed. The architecture can easily be scaled for number of redundancy higher than 16.

While the invention has been described with reference to a preferred embodiment, the description is illustrative of the invention and is not to be construed as limiting the invention. Various modifications and applications may occur to those skilled in the art without departing from the true spirit and scope of the invention as defined by the appended claims.

What is claimed is:

1. A Reed-Solomon decoder comprising
    a syndrome computer including a pipelined functional unit for computing syndromes from a received codeword and storing erasure location numbers as flagged by an Erasure Flag signal, said syndrome computer including two general finite field multipliers, three constant multipliers, two adders, a dual port asynchronous random access memory, and a finite field counter, and a syndrome processor including a pipelined functional unit and a Chien search circuit for receiving from said syndrome computer the computed syndromes, erasure locations, and the number of erasures and computing an erasure locator polynomial, a modified syndrome polynomial, error locator and error evaluator polynomials, an error-erasure locator polynomial, and error value at an error location at each error location found by the Chien search circuit.

2. The Reed-Solomon decoder as defined by claim 1 wherein said syndrome processor includes two asynchronous random access memories for storing syndromes and erasure location numbers from the syndrome computer and for storing all intermediate and final results during syndrome processing, a main processing unit including two general finite field multiplier-adder circuits and a finite field square circuit, and the Chien search circuit, whereby error locations found by the Chien search circuit are supplied to the main processing unit for evaluating the error evaluator polynomial using one multiplier-adder circuit while the even part of the error-erasure locator polynomial is evaluated by the other multiplier-adder circuit, said syndrome processor providing the number of errors and the error location-value pairs when decoding is complete.

* * * * *